United States Patent [19]
von Campe et al.

[11] Patent Number: 4,915,978
[45] Date of Patent: Apr. 10, 1990

[54] METHOD AND DEVICE FOR FORMING A LAYER BY PLASMA-CHEMICAL PROCESS

[75] Inventors: Hilmar von Campe, Bad Homburg; Dietmar Liedtke, Nidderau; Berthold Schum, Biebergemünd; Jörg Wöner, Grobkrotzenburg, all of Fed. Rep. of Germany

[73] Assignee: Nukem GmbH, Main, Fed. Rep. of Germany

[21] Appl. No.: 281,874

[22] Filed: Dec. 8, 1988

Related U.S. Application Data

[63] Continuation of Ser. No. 84,559, Aug. 12, 1987, abandoned.

[30] Foreign Application Priority Data

Aug. 27, 1986 [DE] Fed. Rep. of Germany ....... 3629000

[51] Int. Cl.$^4$ .................. B05D 3/06; C23C 14/00; C23C 16/00
[52] U.S. Cl. .................................. 427/38; 118/723; 118/50.1
[58] Field of Search .................. 427/38, 39; 118/723, 118/50.1; 204/164

[56] References Cited

U.S. PATENT DOCUMENTS

| | | | |
|---|---|---|---|
| 3,677,799 | 7/1972 | Hou | 427/38 |
| 3,976,031 | 8/1976 | Itoh | 427/38 |
| 3,996,884 | 12/1976 | Horiguchi | 118/723 |
| 4,226,897 | 10/1980 | Coleman | 427/39 |
| 4,402,993 | 9/1983 | Aisenberg et al. | 427/38 |
| 4,438,153 | 3/1984 | Pinkhasov | 118/723 |
| 4,438,188 | 3/1984 | Shimatani et al. | 427/39 |
| 4,500,565 | 2/1985 | Hiramoto | 427/39 |
| 4,569,719 | 2/1986 | Coleman | 118/50.1 |
| 4,593,644 | 6/1986 | Hanak | 118/723 |
| 4,657,616 | 4/1987 | Benzing et al. | 118/50.1 |
| 4,676,195 | 6/1987 | Vasui et al. | 427/39 |
| 4,803,332 | 2/1989 | Koyama et al. | 204/164 |

FOREIGN PATENT DOCUMENTS 3020815 12/1981 Fed. Rep. of Germany.

*Primary Examiner*—Norman Morgenstern
*Assistant Examiner*—Marianne L. Padgett
*Attorney, Agent, or Firm*—Cushman, Darby & Cushman

[57] ABSTRACT

A method and a device are proposed for formation of a layer on a surface of a substrate by plasma-chemical process, where the surface is aligned parallel to the electrical field required for the plasma-chemical process. In addition, the gas required therefor flows directly onto the surface.

6 Claims, 7 Drawing Sheets

METHOD AND DEVICE FOR FORMING A LAYER BY PLASMA-CHEMICAL PROCESS

This is a continuation of application Ser. No. 07/084,559, filed Aug. 12, 1987, which was abandoned upon the filing hereof.

The invention relates to a method and a device for forming at least one layer on a surface of a substrate by plasma-chemical process, using at least three electrodes applied perferably to a high-frequency source, said electrodes being arranged in an evacuatable reaction chamber chargeable with gas.

BACKGROUND OF THE INVENTION

Plasma-chemical processes are used, for example, for making solar cells, with formation meaning both deposition of a layer and also "stripping" and treatment in the course of a chemical reaction in a plasma discharge. The latter is known from German patent specification DE-OS 21 52 895, for example, in which the efficiency of a thin-layer solar cell of the copper sulfide/cadmium sulfide type is increased by applying a further copper-containing layer to the copper sulphide layer, said copper-containing layer being thin compared to the copper sulphide layer. The copper content can be generated in the additional layer by reduction of the copper sulphide layer on the surface, by means of treatment in the glow field in a hydrogen atmosphere. The deposition of layers to make functional solar cells is known for example in connection with inversion-layer solar cells. Glow processes are also used, for example, for cleaning reaction chambers used to make a-Si solar cells. Here, the glow discharge is used for cleaning by etching away polysilane or polymers of the doping gases, for example, present in the reaction chamber.

In plasma-chemical processes for depositing amorphous silicon layers, for example, conventional electrode geometries are used. This means that two opposite electrode plates are used. Although this results in a homogeneous electrical field, there are problems with the gas supply if the gas is fed in from the side. This drawback applies particularly when large surfaces have to be coated. At high deposition rates, the gas mixture is depleted of $SiH_4$ and doping gases such as $B_2H_6$ or $PH_3$, with the result that the layer thickness or the doping is irregular.

A further drawback of an electrode arrangement of this type is that the quality of the layer is affected during its growth by bombardment with charged particles, i.e. ions or electrons.

In this connection, an arrangement is known for the deposition of amorphous silicon layers in which the substrate surface to be coated is not arranged between two opposite plate electrodes but laterally outside the platesd, with the intention that the forming electrical field if possible runs parallel to the substrate surface.

A drawback of an arrangement of this type is however that by the very nature of the plate capacitor arrangement a homogeneous field can only be achieved between the plates and when said plates are close enough together, which rules out per se the coating of *large* surfaces with field components parallel to the substrate surface. Outside the plate capacitor, the field is inhomogeneous—particularly at the edges—and also very weak. Coating of large-area substrates in this electrode geometry is therefore difficult and ineffective (low silane yield), because firstly the inhomogeneous field distribution causes an uneven layer thickness and secondly the deposition rate becomes very small as the distance between the plates grows.

The problems of this arrangement are therefore that the fundamental consideration to generate the parallel electrical field between two plates is no longer correct when the plates are widely spaced (distance<<plate diameter), i.e. is no longer suitable for coating large substrates (approx. 100 $cm^2$ or more).

To improve the homogenization of the deposition rate, a third electrode is introduced as an auxiliary electrode which runs parallel to the electrical field. For large-area coating, this electrode system is repeated row by row such that an arrangement of the electrodes with alternating polarity is provided.

FIG. 1a illustrates a system of electrodes with alternating polarity which produces an inhomogeneous electric field. The system includes electrodes (10-20) whose polarity changes from one electrode to the next from $+U$ to $-U$, to $+U$ to $-U$, and so on.

Considering the first dipole given by the electrodes 10, 12, the broken lines show the electric field which is directed from the plus pole to the minus pole. The next dipole given by the electrodes 12, 14, has the same electric field line density, but the field vector has an opposite direction. All the following dipoles are operated in the same manner. In FIG. 1a, only one line of the dipole filed is drawn as a broken line.

The resulting electric field distribution can be found by superposition of the components of all dipole fields, respectively. However, only the contribution of the nearest neighbors has been considered. This is nearly correct because the contributions of the electric field strength of more remote dipoles are small enough to be neglected. By adding the vector components of the electric field in every point, a field distribution results which is drawn by continuous lines in FIG. 1a. The resulting field alternates and is concentrated near the electrode rods (10-20); it is directed vertically to the plane in which the rods are located. Between the rods, the field is weak and directed parallel to the plane in which the rods are located. Therefore, an alternating electrode polarity results in an inhomogeneous electric field which is not well suited for plasma deposition of homogeneous layers.

The electrode configuration as described can be considered as a boundary case for the plate condensator arrangement, too, if the plates are widely spaced (distance <<plate diameter).

A method of the type illustrated in FIG. 1a can be found in U.S. Pat. No. 4,399,014, where a large number of rod-like electrodes are spaced equally. The polarity of the electrodes is also selected to be alternating. The substrate surface to be treated is then between two electrode systems. This method is used commercially for surface glow treatment of plastic PCBs. The heavy bombardment of the surface with ions that is achieved with this arrangement is a consequence of the direction of the accelerating electrical field vertical to the substrate surface. As a result of the particle bombardment the surface is cleaned and better adhesion conditions are obtained by breaking up of chemical bonds. In the case of layer manufacture, however, this effect is undesirable; the reason is that when the electrical field runs vertical to the substrate surface, so that ions and electrons can directly hit the growing layer, a deterioration of the substrate surface occurs, so that a manufacturing method of this type is disadvantageous particularly for thin-layer solar cells such as a-Si cells. Furthermore, the electrical field is inhomogeneous because of its structure (see FIG. 1a), so that this too entails a negative effect on the deposition rate.

SUMMARY OF THE INVENTION

The object of the present invention is to develop the physical principle of a method and a device of the type mentioned at the outset in such a way that large areas can be coated without difficulty, the deposition rate is homogeneous, the electrical field is aligned parallel to the surface to be treated, and a homogeneous gas supply can be achieved.

The object is attained in accordance with the invention by means of a method characterized in that the surface runs completely or almost completely parallel to the electrical field formed between the electrodes, that the gas necessary for formation of the coating flows directly onto the surface between and/or through the electrodes, and that the potential of consecutive electrodes rises steadily. With the theory in accordance with the invention, plasma-aided coating and surface treatment of substrate surfaces and shaped elements, particularly with large, but not necessarily flat, area is possible, the geometry of said surfaces and elements being not necessarily plane in respect of the geometry of the area to be treated. In particular, the theory according to the invention is suitable for making large-area thin-layer solar cells, in particular a-Si solar cells sized $30 \times 30$ cm$^2$, for example, without any inhomogeneity with regard to the deposition rate or any surface damage resulting from ion bombardment. The area can be increased to any size required without changes in the principle being necessary. The apparatus does of course impose limits.

By the theory according to the invention, there is the further advantage that selective material transport to the substrate surface is ensured, so that the reaction gas quantity is highly utilized.

To be able to plasma-treat the surface, for example, of cylindrical elements, for example, or of other geometries by the method in accordance with the invention, an embodiment of the invention proposes that the surfaces be aligned substantially parallel to the envelopes formed by the electrodes. In other words, the electrode arrangement only needs to be arranged to correspond to the geometric pattern of the surface to be treated in order to clean this surface by plasma discharge and/or to deposit a layer.

It is possible here to use ring electrodes, for example, arranged coaxially to the substrate to achieve a plasma-chemical treatment in continuous operation too, i.e. the substrate can be shifted along the main axis resulting from the ring electrode.

A device for forming a layer on a surface of a substrate by a plasma-chemical process, where the substrate is arranged in an evacuatable reaction chamber having substrate heating and at least three electrodes supplied preferably by a high-frequency source and having a supply of gas necessary for the plasma-chemical process, is characterized by the fact that the electrodes form an envelope corresponding to the pattern of the electrical field forming between the electrodes and running parallel or nearly parallel to the surface and that gas is emittable to the surface with even distribution by the gas supply device. In an embodiment of the invention, the electrode is formed as a hollow cylinder and has outlets for gas flowing through the electrodes.

This has the advantage that the gas is directly and evenly emitted over the surface to be treated, with the result that an extremely homogeneous deposition rate is achievable. By the arrangement of the electrodes in a notional area, with said electrodes running approximately parallel to the substrate surface to be treated, it is ensured that the electrical field forming between the electrodes runs parallel to the surface to be treated. The result is that ion bombardment of the surface does not take place and so there is no negative effect on the layer formed by the plasma-chemical process.

Further details, advantages and features of the invention can be found not only in the claims and in the features which can be gathered therefrom—singly or in combination, but also in the following description of preferred embodiments shown in the drawing.

BRIEF DESCRIPTION OF FIGURES OF DRAWING

FIG. 1a shows a field line distribution of an electrical field according to to the prior art, FIG. 1b shows a field line distribution of an electrical field obtained according to the invention, FIG. 2 shows a corresponding field line distribution by electrostatic induction, FIG. 3 shows an electrode arrangement for coating a shaped element, FIG. 4 shows the circuit arrangement of the electrodes according to FIG. 3 and FIG. 5 shows electrodes with gas supply, FIG. 6 shows a further embodiment of the electrode arrangement and FIG. 7 shows a further embodiment of an electrode arrangement.

DESCRIPTION OF PREFERRED EMBODIMENTS

Figure 1A:
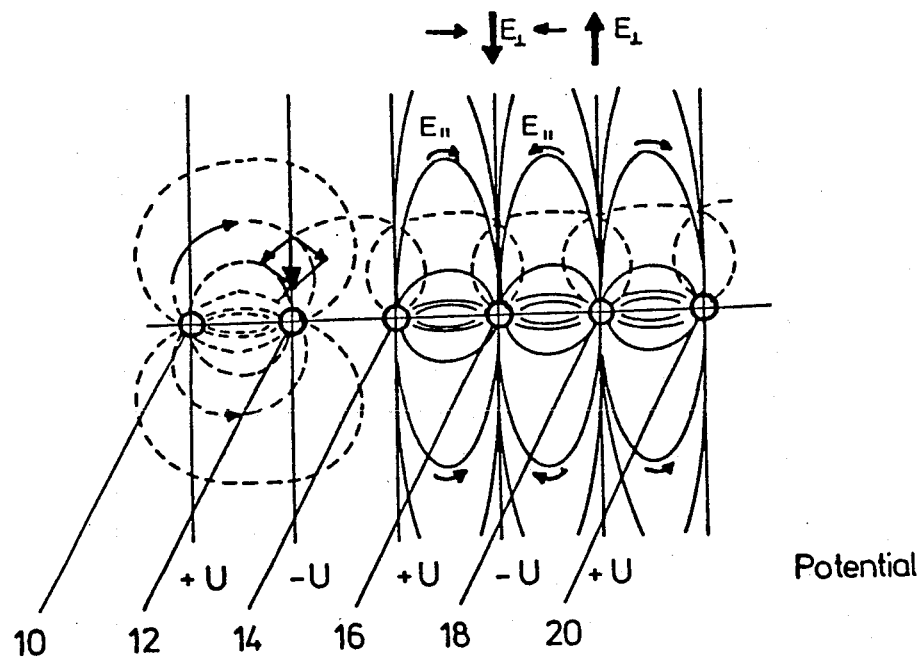

FIG. 1a shows a field line distribution of an electrical field running between electrodes applied to alternating potential, i.e. following an arrangement to be found in U.S. Pat. No. 4,399,014. The drawback of this arrangement is that the surface of a substrate to be treated is bombarded with charged particles, with the risk of damage being incurred. In accordance with the present invention, a fundamental departure is made from the alternating polarity according to the prior art in order to treat large areas of 30 cm$^2$, and preferably 100 cm$^2$ or more, without difficulty.

Substrate, substrate heater, electrode system and gas supply are provided in a reaction chamber (not illustrated) such as a plasma reactor. In such a reaction chamber, a substrate surface is now to be treated, i.e. a layer is deposited, for example, on a surface, or the surface is cleaned, for example. Applications are, for example, the manufacture of thin-layer solar cells of amorphous silicon in solar engineering, for example. However, workpiece coatings for surface refinement by, for example, metallic materials, oxides, nitrides or carbides are also applications for the present invention, without this resulting in any limitation.

Figure 1B:
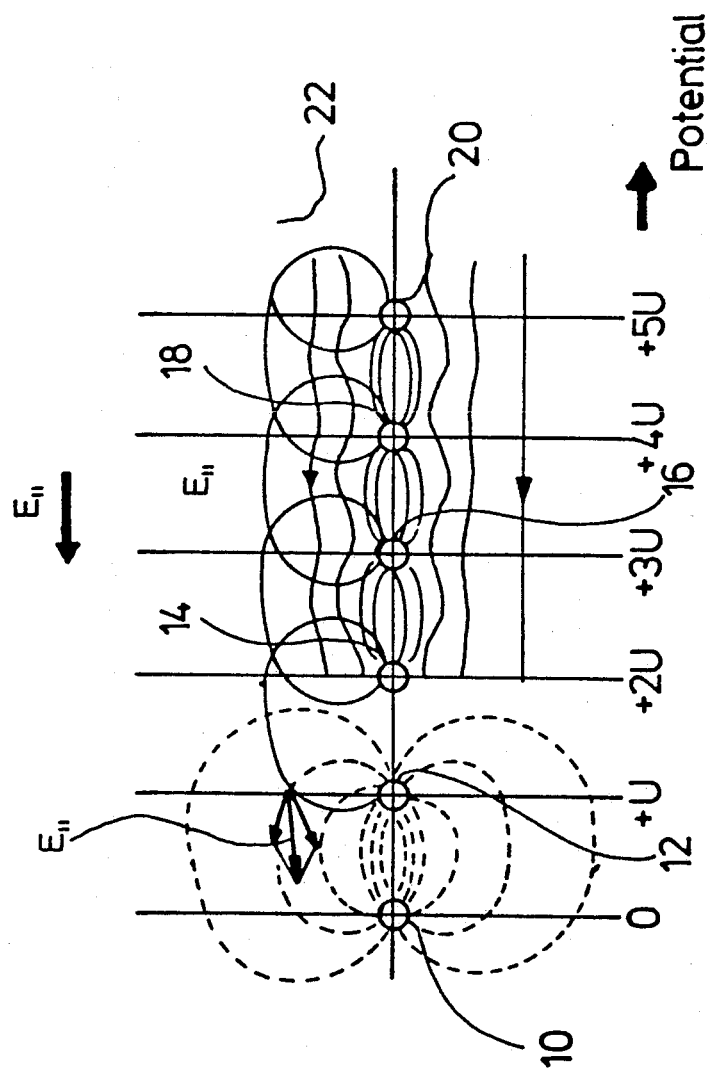
Figure 2:
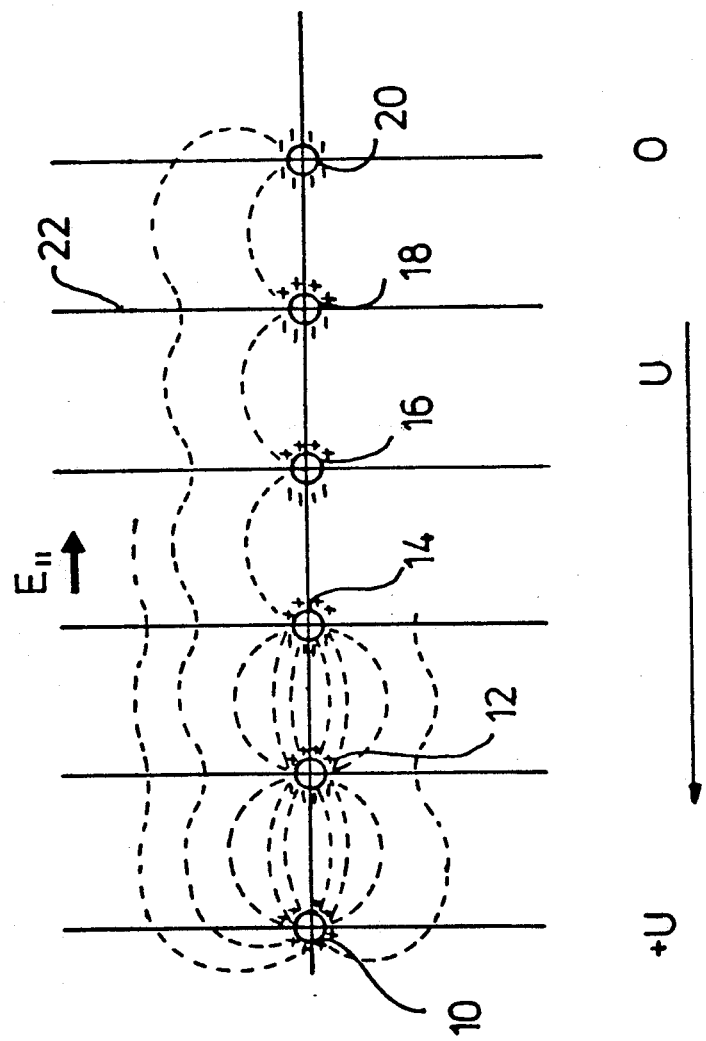

The electrode system itself comprises in the embodiment of FIGS. 1b and 2 several cylindrical or tubular conductive rods (10), (12), (14), (16), (18) or (20) arranged parallel. The substrate (22) is spaced several centimeters from the electrodes (10) to (20). Plasma- or glow discharge then takes place by high-frequency AC voltage after supply of a gas. Of course a high-frequency source can also be substituted by a direct voltage source.

The various electrodes (10) to (20) are arranged such that the electrical field of discharge is aligned parallel to the substrate surface. If we observe in FIG. 1a at a certain point in time the potentials of the electrodes (10) to (20), then the field distribution shown in accordance with the superposition principle is achieved when two adjacent electrodes have the same potential difference $p_i - p_{i-1} = u$. Since $p_i - p_{i-1}$ is to be identical for all electrodes (10) to (20) for the entire period, note must be taken of the phase position in the event of HF discharge. Suitable RC networks are provided for this purpose. In the embodiment, the potential rises evenly, as is made clear by the abscissa values 0, u, 2u ....

An appropriate field distribution at least for low frequencies can be achieved by exploiting the influence, as is made clear in FIG. 2. The electrodes (10) to (20) provided with identical reference numbers can also be recognized, as can the generation of the electrical field by influence, the outer electrodes (10) and (20) being applied to the potential 0 and +u respectively.

It can be seen from the field line pattern that the electrical field becomes homogeneous at a certain distance from the electrode system. Furthermore, it is aligned parallel to the substrate surface to be coated, so that the electrons and ions are horizontally accelerated and cannot hit the substrate surface. This prevents any ion bombardment of the coating to be formed. This is of particular advantage for the manufacture of amorphous silicon layers for large-area thin-layer solar cells. The wiring arrangement of the electrodes (10) to (20) as previously described also permits a large-area coating of substrates with other materials. Thanks to the homogeneity of the field in the substrate plane, the deposition rate is extremely even.

In addition, the formation of the electrodes according to the invention and their relation to one another permits the gas required for the plasma-chemical process to evenly cover the surface to be treated. When the electrodes (10) to (20) are designed as hollow-cylinder tubes, the gas can advantageously be fed without decomposition into the interiors of the tubes in order to pass directly to the substrate (22) via recesses such as slits or holes (86), (88), (90). This is implied in FIG. 5. The gas is supplied from a source (92) such as a gas bottle via valves (94), (96) and a flow meter (98) to the electrodes (10) to (18), the connection inside the reactor chamber being a quick-action coupling (100) that would permit a rapid replacement of suitable electrode systems (according to FIGS. 4-6) in the case of shaped element coating.

The gas supply system is accordingly integrated into electrodes (10) to (20), it being possible to design said system as a detachable module by means of the quick-action coupling (100). A suitable gas supply system affords the advantages over conventional arrangements that gas can flow directly from the front over the surfaces to be treated. This even gas flow ensures that the deposition rate is accordingly extremely homogeneous. By passing gas inside the electrodes (10)d to (18), the gas reaches the substrate surface directly and without any decomposition. Used gas can be drawn off directly, so that a stationary condition between the supply of fresh and the removal of used gas develops in a short time. Accordingly, long-term changes in the reaction atmosphere due to enrichment of used constituents is precluded.

To prevent any pressure drop becoming effective inside the electrode due to outflowing gas, the size of the recesses and/or their spacing can be varied along each electrode.

Figure 3:
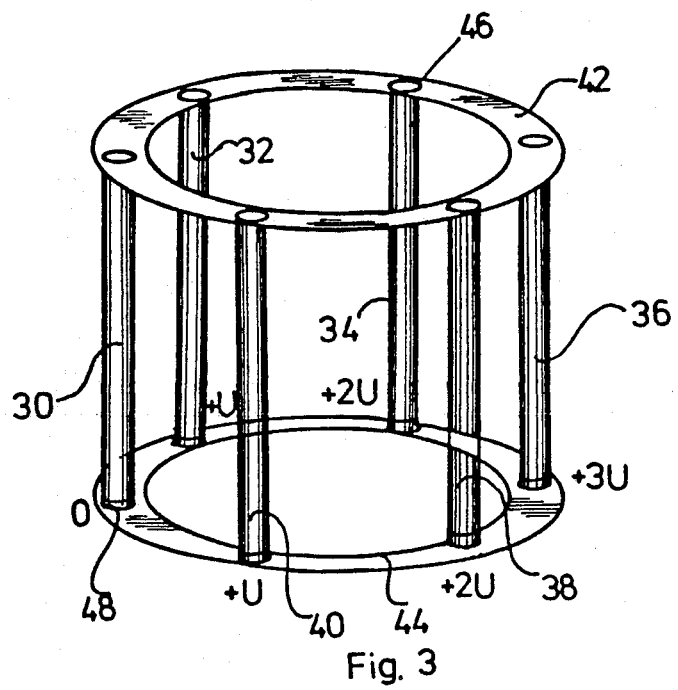
Figure 4:
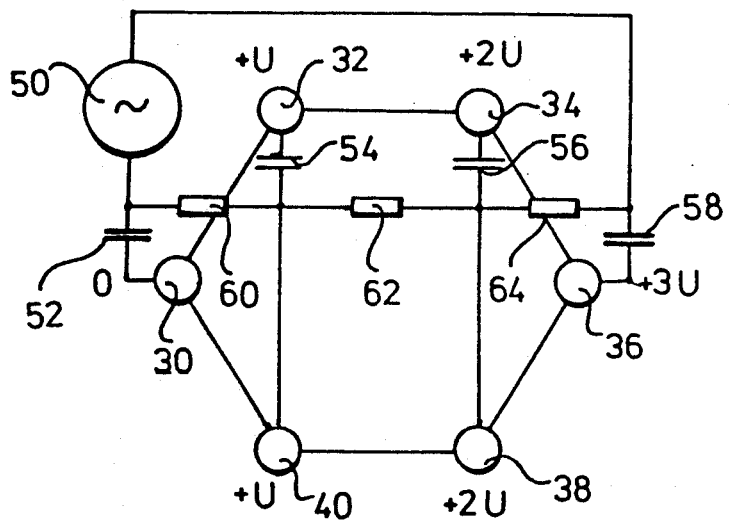
Figure 5:
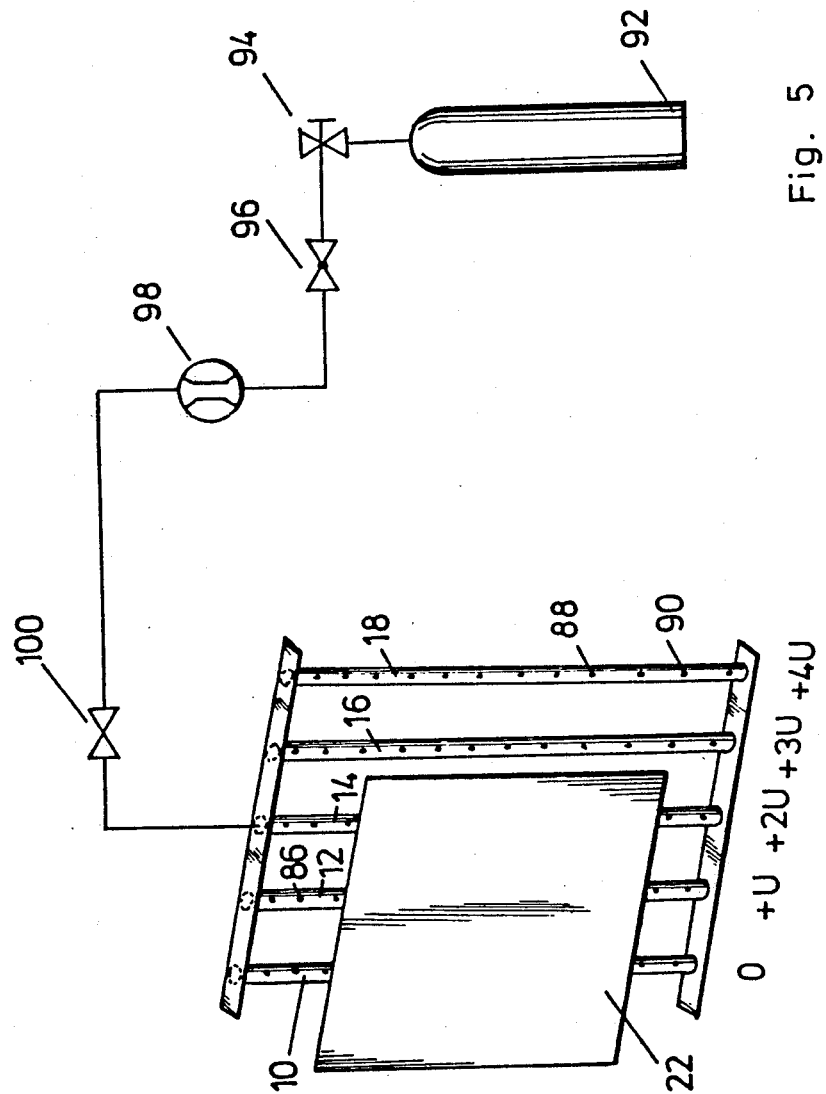
Figure 6:
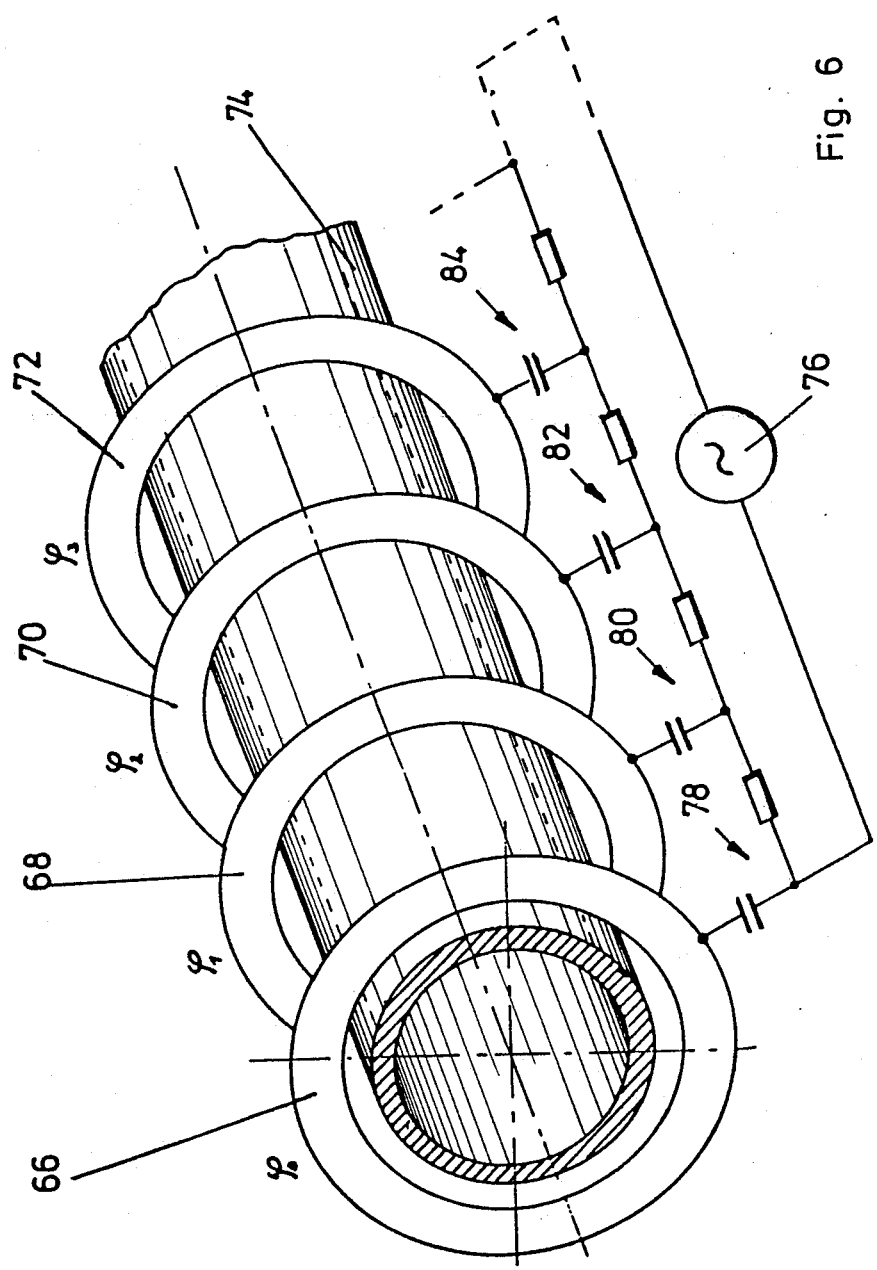

FIGS. 3, 4 and 6 illustrate specific embodiments of electrode arrangements. In FIG. 4, rod-like electrodes (30), (32), (34), (36), (38) and (40) are arranged on a cylinder jacket, in order to coat tubes in particular from the inside or the outside, or other shaped elements. The arrangement of the electrodes (30) to (40) is adjusted here to the geometry of the substrate surface to be treated. It is also possible here to coat the inner surfaces of a hollow body. In order to heat up the substrate to the requisite level, a direct connection with a heater is not necessary; instead warmup can be achieved by radiation or current flow heating of the substrate itself.

The electrodes (30) to (40) are mounted at the faces in an insulating manner in support rings (42), (44). This is possible using insulating rings shown by way of example with the reference numbers (46) and (48).

The electrical arrangement of the electrodes (30) to (40) is in accordance with the illustration FIG. 4. It can be seen that a high-frequency AC voltage is used as the source (50), which is connected via RC networks comprising capacitors (52), (54), (56), (58), and resistors (60), (62), (64) to the electrodes (30) to (40), in order to achieve an identical potential difference between consecutive electrodes. This is implied by the fact that the electrodes are provided with potentials $\rho_0 = 0$, $\rho_1 = u$, $\rho_2 = 2u$ and $\rho_3 = 3u$, with the difference between $\rho_0$ and $\rho_1$, $\rho_1$ and $\rho_2$, and $\rho_2$ and $\rho_3$ respectively being identical, and the potential to the following electrodes (36) and (40), and (34) and (30) and (32) rises continuously in relation to the edge electrode (38).

Based on electrode (38), the potential increases on both sides of the ring on which the electrodes (30) to (40) are arranged. Parallel to this ring, i.e. to the support rings (42), (44), the electrical field between the electrodes (30) to (40) aligns itself to the superposition principle so that a shaped element can be treated by plasma-chemical process without difficulty.

In FIG. 6, an alternative arrangement of electrodes (66), (68), (70), (72) is shown, using which a shaped element such as a tube (74) is also to be treated, in particular coated. The electrodes (66) to (72) are ring electrodes arranged coaxially to the tube to be coated (74). The electrodes (66) to (72) are also connected to a high-frequency voltage source (76) via RC networks (78), (80), (82), (84), in order to set not just an identical potential difference from electrode to electrode, i.e. between electrodes (66) and (68), (68) and (70), and (70) and (72), but also a continuously rising potential.

If the electrodes are not arranged in a plane but, for example, on a cylinder jacket (FIG. 3) and/or designed as ring electrodes (FIG. 6), an arrangement with alternating polarity can also be selected, without necessarily forgoing the advantages achieved by the invention.

It is furthermore possible that the objects to be treated can be rotated about the symmetry axis in the arrangement according to FIG. 3 or conveyed in the direction of the symmetry axis in the arrangement according to FIG. 6, so that a plasma-chemical process in continuous operation takes place.

Figure 7:
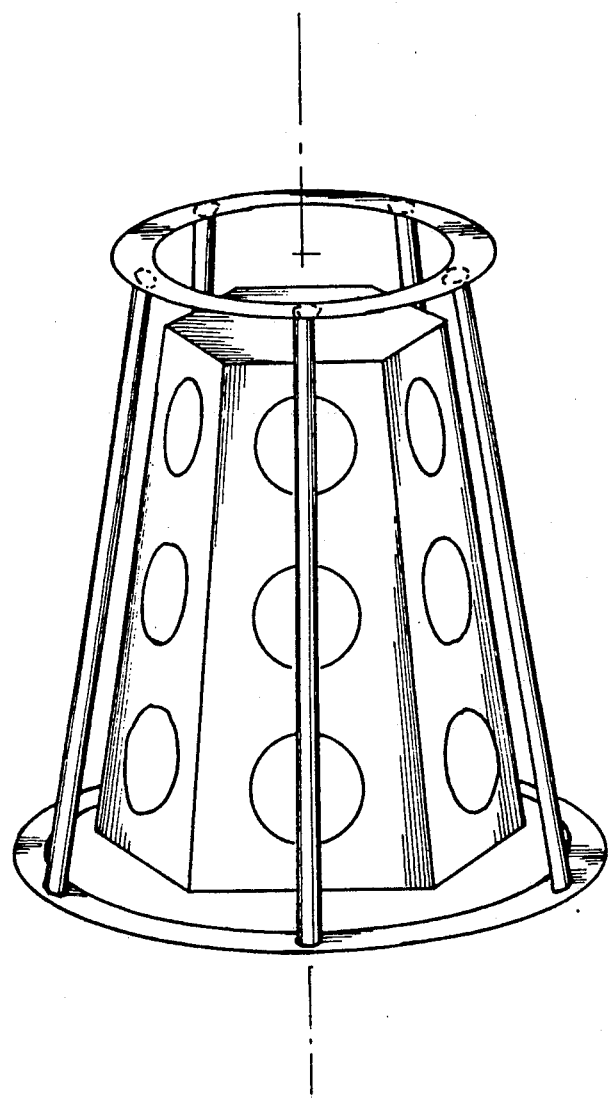

If an arrangement according to FIG. 4 is to be used for shaped elements which are not cylindrically symmetrical, the electrical field can be adapted to the envelope of the shaped element by altering the spacing of the rod electrodes, as shown in FIG. 7, around the substrate surface.

It is also possible by alteration of the distance from ring to ring or by adapting the electrode potential using RC networks to adapt the envelope formed by the electrical field to that of the shaped element.

The electrodes themselves can be attached in a self-supporting embodiment (FIG. 6) or to insulating supports (FIG. 2). It is also possible to arrange a strip conductor or wires on the outside and or inside of a tube, on the surface of a plate or another surface (which is to be adapted to the geometrical form of the element to be coated), in order to realize the theory in accordance with the invention.

We claim:

1. A device for forming at least one layer on a surface of a substrate by a plasma-chemical process, comprising an evacuatable reaction chamber, at least three electrodes mounted in said chamber a voltage source operatively connected to said electrodes so as to increase or decrease the potential over all of said at least three electrodes and to establish a potential difference $\Delta U$ between adjacent electrodes which is identical in each case and at least one supply device for introducing the gas required for the process whereby the electrodes form an envelope corresponding to the pattern of the electrical field between the electrodes, and means for mounting a substrate in said chamber so that the pattern of the electrical field runs parallel or nearly parallel to the surface of said substrate, said supply device so that gas is emmittable to said surface with even distribution and means for drawing off the used gas directly from said surface.

2. A device as set forth in claim 1 in which said voltage source is a high-frequency voltage source.

3. A device according to claim 1, characterized in that the electrodes (10, 12, 14, 16, 18, 20, 30, 32, 34, 36, 38, 40) are in hollow cylinder form and have outlet openings (86, 88, 90) for the gas.

4. A device according to claim 1, characterized in that the electrodes are ring electrodes (66, 68, 70, 72) arranged coaxially to the substrate (74).

5. A device according to claim 1, characterized in that the electrodes are arranged on the peripheral surface of a cylinder.

6. A plasma-chemical process for forming at least one large-area layer on a surface of a substrate, using at least three electrodes formed as rod or ring electrodes mounted in an evacuable reaction chamber, said process comprising operatively connecting said at least three electrodes to a power supply so that a potential exists over all of said at least three electrodes which increases or decreases progressively from electrode-to-electrode by an increment $\Delta U$ between adjacent electrodes, the potential difference between successive electrodes being, in each case, of the same magnitude, thereby producing an electric field between the electrodes which is parallel to an area or envelope defined by the electrodes and the spaces between them, positioning the surface of the substrate substantially parallel to the area or envelope defined by the electrodes and the spaces between them so as to prevent ion and electron bombardment of said surface, flowing gas into said chamber directly between or through said electrodes onto said surface which is to be developed by the plasma-chemical process and drawing off used gas directly from the surface of said substrate.

* * * * *